United States Patent [19]

Berkstresser et al.

[11] Patent Number: 4,835,437
[45] Date of Patent: May 30, 1989

[54] CATHODE RAY TUBE WITH SINGLE CRYSTAL TARGET

[75] Inventors: George W. Berkstresser, Bridgewater; Charles D. Brandle, Jr., Basking Ridge, both of N.J.

[73] Assignee: American Telephone and Telegraph Company, AT&T Bell Laboratories, Murray Hill, N.J.

[21] Appl. No.: 195,435

[22] Filed: May 16, 1988

Related U.S. Application Data

[63] Continuation of Ser. No. 827,405, Feb. 10, 1986, abandoned.

[51] Int. Cl.⁴ .............................................. H01J 29/20
[52] U.S. Cl. .................................... 313/468; 313/474
[58] Field of Search ......................... 313/474, 468, 479

[56] References Cited

U.S. PATENT DOCUMENTS

| | | | |
|---|---|---|---|
| 4,298,820 | 11/1981 | Bongers et al. | |
| 4,314,910 | 2/1982 | Barnes | 313/468 X |
| 4,550,256 | 10/1985 | Berkstresser et al. | 313/468 X |
| 4,713,577 | 12/1987 | Gualtieri et al. | 313/468 |

OTHER PUBLICATIONS

*Applied Physics Letters*, 37(5), 9/1/80, "Epitaxially Grown Monocrystalline Garnet Cathode-Ray Tube Phosphor Screens", J. M. Robertson et al., pp. 471–472.
*IBM Technical Disclosure Bulletin*, vol. 25(5), 10/82, "Surface-Textured Epitaxial Luminescent Films with High Optical Efficiency for Projection Cathode Ray Tubes", I. F. Chang et al., p. 2630.
*Journal of Crystal Growth*, 17, (1972), "The Growth of Magnetic Garnets by Liquid Phase Epitaxy", S. L. Blank et al., pp. 302–311.
*IEEE Transactions on Magnetics*, Jul. 1976, "Bubble Domain Memory Materials", James W. Nielsen, pp. 327–345.
Paper for Electrochemical Society Meeting, 10/14–18/85, "An Improved Terbium Activated Single Crystal Phosphor for Head Up Display Cathode Ray Tube", G. W. Berkstresser et al.
*Philips Journal of Research*, vol. 36, No. 1, "Colourshift of the Ce$^{3+}$ Emission in Monocrystalline Epitaxially Grown Garnet Layers" by J. M. Robertson et al, pp. 15–30, (1981).

*Primary Examiner*—Palmer C. DeMeo
*Attorney, Agent, or Firm*—Walter G. Nilsen; Ronald G. Ort

[57] ABSTRACT

Light output of single crystal phosphors used on cathode ray tubes can be vastly improved by use of a microfaceted surface structure conveniently produced by use of a single crystal epitaxial layer with lattice constant slightly larger than the single crystal substrate. Such epitaxial layers are conveniently grown using substituents that increase the lattice constant compared to the single crystal substrate.

9 Claims, 1 Drawing Sheet

CATHODE RAY TUBE WITH SINGLE CRYSTAL TARGET

The government has rights to this invention pursuant to Contract No. F33615-83-C-1072 awarded by the United States Air Force.

This application is a continuation of application Ser. No. 827,405, filed Feb. 10, 1986, and now abandoned.

TECHNICAL FIELD

The invention involves a cathode ray tube and a method of making cathode ray tubes.

BACKGROUND OF THE INVENTION

Cathode ray tubes are used extensively in a variety of display applications including direct view and projection television sets, monitors for computer terminals, television and avionics systems, etc. In many applications (such as projection tubes), high image brightness is required which can only be obtained by the use of a very high power density electron beam. Such high power densities often degrade conventional cathode ray tubes and therefore limit the lifetime of high intensity cathode ray tubes.

A significant advance in the development of high intensity cathode ray tubes was the discovery that certain luminescent epitaxial garnet films on single crystal substrates could withstand much higher power densities than with polycrystalline phosphors without tube degradation (see, for example, J. M. Robertson et al., Applied Physics Letters, 37(5), pp. 471–472, Sept. 1, 1980). Several systems were examined using yttrium aluminum garnet as the substrate and various activators in yttrium aluminum garnet in the epitaxial layers. The activators examined were Tb, Eu, Pr, Tm and Ce. The epitaxial layers were grown by liquid phase epitaxy using a $PbO-B_2O_3$ flux.

These types of fluorescent screens did indeed withstand much higher electron power densities than conventional screens and maintained their performance without long term degradation. Because of the magnitude of the index of refraction (1.84 at 550 nm for yttrium aluminum garnet), a large fraction of the light generated within the single crystal luminescent screen is trapped by internal reflection. It is highly desirable to increase the fraction of generated light extracted from the single crystal screen.

Various proposals have been made to increase the amount of light exiting the single crystal cathode ray tube. One proposal, described by P. F. Bongers et al. in U.S. Pat. No. 4,298,820 issued on Nov. 3, 1981, has a surface epitaxial layer on the luminescent screen with V-shaped grooves. These grooves increased the amount of light exiting the tube. The pattern of grooves was produced by an etching procedure on the epitaxial film, but such a procedure is difficult to carry out on such chemically stable crystals as yttrium aluminum garnet. An alternative procedure, described by I. F. Chang et al., IBM Technical Disclosure Bulletin, 25(5), 1982, page 2630, involves the immersion of the garnet layer in a fluxed melt at a temperature above the saturation temperature of the fluxed melt. This procedure leads to dissolution of part of the epitaxial layer to form a facet surface structure. An alternative approach is to form facets on the single crystal substrate via etching prior to the growth of the luminescent layer.

Single crystal cathode ray tubes would be much more attractive commercially if a simple, easily made structure could be devised to couple light out of the structure. Particularly attractive would be a process which was easy, reliable, and attractive from a commercial fabrication point of view. In particular, the surface structure of the tube and process for making the tube should not induce detrimental mechanical defects in the cathode ray tube, adversely affect the cathodoluminescence efficiency, and preferably be applicable to a wide variety of crystal orientations and material systems.

SUMMARY OF THE INVENTION

The invention is a cathode ray tube in which the tube face comprises single crystal substrate at least partially covered by epitaxial film with microfaceted surface. These pyramid-like structures have a base dimension of typically approximately 3–10 $\mu$m and serve as a very effective method of enhancing luminous output of a single crystal faceplate of a cathode ray tube. Generally, the epitaxial layer is of such composition (usually close but not exactly the same as the composition of the single crystal substrate) that the lattice parameter is slightly larger for the epitaxial layer than the single crystal substrate. Also included in the invention is a method of making such a microfaceted CRT faceplate. Here, an epitaxial layer, with composition so that the lattice constant is slightly larger than that of the substrate, is grown on the substrate. The epitaxial layer is grown by liquid phase epitaxial process discussed in a number of references including "The Growth of Magnetic Garnets by Liquid Phase Epitaxy," by S. L. Blank and J. W. Nielsen, Journal of Crystal Growth, 17 (1972), pp. 302–311, and "Bubble Domain Memory Materials," by James W. Nielsen, IEEE Transactions on Magnetics, Vol. MAG-12, No. 4, July 1976, pp. 327–345. Growth of such a composition produces facets which greatly enhance the amount of light exiting the faceplate.

The microfaceted surface is part of an epitaxial layer on the single crystal faceplate with composition such that the lattice constant at ambient temperatures is at least 0.005 to 0.04 Angstroms larger than the substrate. Where the lattice constant of the epitaxial layer is less than about 0.005 Angstroms larger than the substrate, faceting usually does not occur; greater than about 0.075 Angstroms, epitaxial growth usually does not occur. Preferred limits are 0.015 to 0.065 Angstroms and most preferred limits are 0.045±0.015 Angstroms. Such cathode ray tubes exhibit enhanced light output compared to conventional cathode ray tubes operated under the same cathode luminescence conditions. Also, luminescence efficiency is not degraded by the composition changes necessary to produce the microfaceted faceplate. Furthermore, the fabrication procedure is relatively easy to carry out and is adaptable to mass production.

DETAILED DESCRIPTION

The invention is based on the discovery that epitaxial layers grown on single crystal substrates, where the lattice constant of the epitaxial layer is slightly larger than the lattice constant of the substrate, yields a microfaceted structure useful in a variety of applications. The microfaceted configuration is particularly useful for coupling light out of a transparent structure (e.g., disc or rectangular plate, etc.) with a high index of refraction where much of the light is trapped inside the transparent structure due to total internal reflection. Attractive applications are to single crystal faceplates on cathode ray tubes where the faceplate on the tubes is single crystal with high index of refraction. The microfaceted structure is composed of small pyramid-like structures having a typical base dimension of approximately 3-10 $\mu$m. They serve as an effective method of enhancing luminous output of a cathode ray tube and are particularly useful for projection cathode ray tubes with single crystal faceplates for the cathode ray tube.

The invention is typically applicable to cathode ray tubes with single crystal faceplates such as yttrium aluminum garnet, yttrium scandium aluminum garnet ($Y_3ScAl_4O_{12}$), and gadolinium gallium garnet. Generally, the single crystal used as the faceplate should be largely transparent, capable of being grown in the form of large single crystals for fabrication into substrates capable of activation for cathodoluminescence either by doping directly or doped epitaxial layers on the single crystal, and be otherwise suitable for use of cathode ray tubes. A large variety of single crystal materials may be used in the practice of the invention including, for example, barium hexa-aluminate, yttrium orthosilicate, and the garnet system. The garnet system, particularly those mentioned above, are preferred because of their excellent cathodoluminescence properties, ease of growth of bulk crystals and ease of growing epitaxial layers upon the garnet substrate.

Various structures of the faceplate may be used consistent with the practice of the invention. Generally, the microfaceted structure is located in an epitaxial layer, adjusted in composition so that the microfaceted structure forms on growth. Typically, this is done by fixing the composition of the epitaxial layer so that the lattice constant is slightly larger than the lattice constant of the substrate. The activator ions (typically phosphorescent ions such as $Ce^{+3}$, $Tb^{+3}$, etc.) may be present in this epitaxial layer, in another epitaxial layer on top of the epitaxial layer containing the microfacets, or in the substrate. Generally, the first two alternative are preferred since in the latter case where the activator ions are located in the substrate, the electron beam must penetrate the epitaxial layer before entering the activated region.

Figure 1:
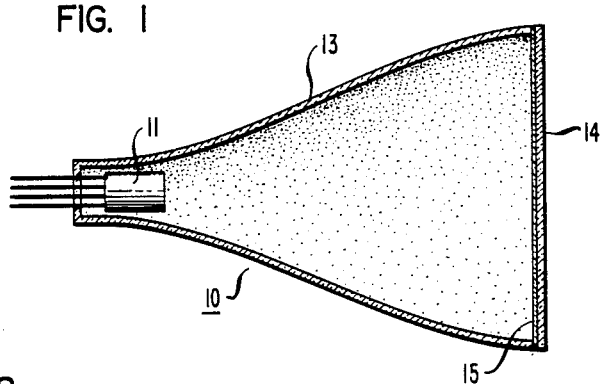
FIG. 1 shows a schematic cross-sectional view of a cathode ray display device.

The faceplate structure described above is most usefully used in a cathode ray tube, generally one designed for high image brightness, either for use in a projection system or in the presence of high-background light. A typical cathode ray tube is shown in FIG. 1. The cathode ray tube 10 is made up of an electron radiation source, 11, with means for electrical connection to outside source of electrical signal 12, an enclosure usually made of glass 13, a single crystal substrate 14 with microfaceted structure and activated region 15.

Particularly useful in an understanding of the invention is a description of several specific particular systems. Yttrium aluminum garnet is a readily available faceplate material which has excellent qualities such as good cathodoluminescent properties when properly doped, ability to withstand high electron-beam densities without saturation or damage, and well-developed procedure for growing epitaxial layers. Also, gallium can be substituted for aluminum for the gradual increase in the lattice constant for use in the epitaxial layer with microfaceted structure.

Figure 2:
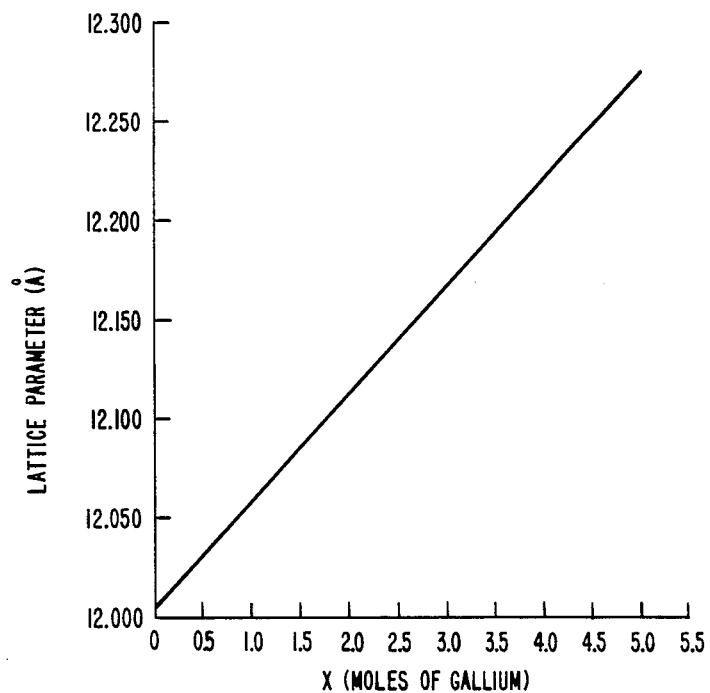
FIG. 2 shows in graphical form data on lattice constant in the yttrium aluminum garnet-yttrium gallium garnet crystal system.

The composition of the epitaxial layer depends on the substrate and amount of increased lattice constant required to produce the microfaceted structure. FIG. 2 shows, for the yttrium aluminum garnet-yttrium gallium garnet system, a graph of lattice constant versus garnet composition. The lattice constant of pure yttrium aluminum garnet is 12.007 Angstroms; of pure yttrium gallium garnet 12.280 Angstroms. Each mole of gallium substituted for aluminum increases the lattice constant of yttrium aluminum garnet by +0.0546 Angstroms. Typically, smaller amounts of expansion are most useful, generally of the order of 0.015-0.075 Angstroms.

The $Tb^{+3}$ activated yttrium aluminum garnet system provides an excellent illustration of the invention. Conventionally, a $Tb^{+3}$ activated yttrium aluminum garnet film is grown on a yttrium aluminum garnet single crystal substrate to provide the cathodoluminescence needed in the cathode ray tube. This epitaxial layer conventionally has a composition of $(Y_{2.9}Tb_{0.1})Al_5O_{12}$ and is grown at high temperatures (typically around 1060 degrees C.) from a $PbO-B_2O_3$ flux.

The microfaceted structure is grown using a composition in which some of the aluminum is replaced by gallium to provide the increased lattice constant. The composition of the melt used to grow the epitaxial film is given in Table I. Growth was carried out at a temperature of 1060 degrees C. at a rate of 1.67 $\mu$m/minute to yield a film with a thickness of 8.11 $\mu$m. This resulted in an epitaxial film with approximate composition $(Y_{2.9}Tb_{0.1})(Al_{4.6}Ga_{0.4})O_{12}$ which then results in a film lattice constant of approximately 0.022 Angstroms greater than that of $Y_3Al_5O_{12}$.

TABLE I

| Melt Composition for Epitaxial Growth | |
|---|---|
| Compound | Weight in Grams |
| $Y_2O_3$ | 5.917 |
| $Tb_4O_7$ | 0.462 |
| $Al_2O_3$ | 10.03 |
| $Ga_2O_3$ | 6.148 |
| PbO | 1000 |
| $B_2O_3$ | 25.61 |

Figure 3:
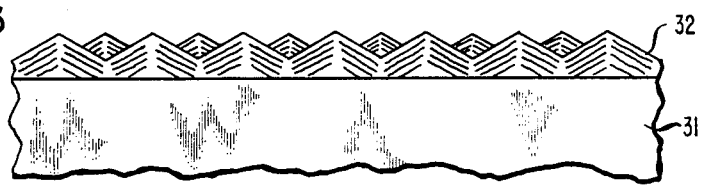
FIG. 3 is an edge view of a single crystal faceplate with microfaceted structure made in accordance with the invention.

Growth of the epitaxial layer in this way yields a microfaceted layer as shown in FIG. 3. Here is shown an edge view of a faceplate with single crystal substrate 31 and microfaceted epitaxial layer 32. In the yttrium aluminum garnet-yttrium gallium garnet described above (and probably other garnet systems), the surface of the substrate is a <111> crystal plane and the facets are <110> and <211> planes.

Measurements were carried out to compare the light output of the tube described above with a tube without the microfaceted structure. For electron beam excitation with high power density ($1 \times 10^{10}$ W/m$^2$), the microfaceted tube prepared from the melt of Table I has about 23 percent more light output under identical conditions than the tube without a microfaceted epitaxial layer. For low power density excitation ($10^6$ W/m$^2$), the improvement in light output is about 50 percent.

As mentioned above, the microfaceted structure may be made without the phosphor activator ions in the microfaceted layer and with the phosphor epitaxial layer over the microfaceted epitaxial layer. The microfaceted epitaxial layer is grown on a substrate of yttrium aluminum garnet using a melt composition which yields the approximate composition $Y_3(Al_{4.6}Ga_{0.4})O_{12}$ in the microfaceted layer. Melt composition for growth of this microfaceted layer is given in Table II.

TABLE II

Melt Composition For Growing Epitaxial Microfaceted Layer on Yttrium Aluminum Garnet

| Compound | Weight in Grams |
|---|---|
| $Y_2O_3$ | 10.00 |
| $Al_2O_3$ | 16.95 |
| $Ga_2O_3$ | 13.35 |
| PbO | 1500 |
| $B_2O_3$ | 38.87 |

The microfaceted epitaxial layer was grown at 1080 degrees C. at a growth rate of 1.53 μm/minute to a thickness of 10.10 μm.

The epitaxial phosphor layer is then grown on top of this microfaceted layer using a melt composition set forth in Table III to yield an epitaxial layer composition of $(Y_{2.785}Ce_{0.015}Tb_{0.2})(Al_5O_{12})$. The phosphor epitaxial layer is grown at 1008 degrees C. at a rate of 4.05 μm/minute to a thickness of 5.67 μm.

TABLE III

Melt Composition For Growing Epitaxial Activated Layer on Microfaceted Layer

| Compound | Weight in Grams |
|---|---|
| $Y_2O_3$ | 10.00 |
| $CeO_2$ | 4.052 |
| $Tb_4O_7$ | 1.76 |
| $Al_2O_3$ | 16.95 |
| PbO | 1640 |
| $B_2O_3$ | 42.49 |

The similar degree of microfacet formation which results from the two layer structure of (a) facet producing layer from a melt of composition given in Table II, and (b) a luminescent layer from the melt of composition given in Table III produce similar performance enhancement. For high power density excitation ($1 \times 10^{10}$ W/m$^2$), the improvement is 35 percent relative to a tube fabricated without microfaceted epitaxial layers. At conditions of low power excitation ($1 \times 10^6$ W/m$^2$), the performance improvement was 32 percent.

Another example for preparation of the microfaceted epitaxial film by partial substitution of aluminum by gallium is given by growth of epitaxial film from the melt composition given in Table IV.

TABLE IV

Melt Composition for Epitaxial Growth

| Component | Weight in Grams |
|---|---|
| $Y_2O_3$ | 7.700 |
| $Tb_4O_7$ | 0.600 |
| $Lu_2O_3$ | 0.0 |
| $Al_2O_3$ | 13.030 |
| $Ga_2O_3$ | 21.970 |
| PbO | 1250 |
| $B_2O_3$ | 33.40 |

Film growth was carried out at a temperature of approximately 1058 degrees C. and a growth rate of 1.72 μm/minute to yield a film thickness of approximately 5.16 μm. This resulted in an epitaxial film with the approximate composition $(Y_{2.9}Tb_{0.1})(Al_4Ga_1)O_{12}$, which has a lattice constant of approximately 0.056 Angstroms greater than the $Y_3Al_5O_{12}$ substrate.

With the growth of a $(Y_{2.9}Tb_{0.1})(Al_1Ga_4)O_{12}$ epitaxial film, the amount of lattice constant mismatch is much in excess of that considered feasible from previous literature on epitaxial growth of rare earth garnets from the $PbO/B_3O_2$ flux. (See Blank and Nielsen and Nielsen cited previously.)

To access the performance of the microfacted film grown from the melt of Table IV, sufficient $Lu_2O_3$ was added to modify the composition to that listed in Table V. Growth of an epitaxial film was performed at 1049 degrees C. and a growth rate of 2.35 μm/minute for a period of time to produce a 4.70 μm thick film.

TABLE V

Melt Composition For Epitaxial Growth

| Component | Weight in Grams |
|---|---|
| $Y_2O_3$ | 7.70 |
| $Tb_4O_7$ | 0.60 |
| $Lu_2O_3$ | 13.50 |
| $Al_2O_3$ | 13.03 |
| $Ga_2O_3$ | 21.97 |
| PbO | 1750 |
| $B_2O_3$ | 46.40 |

The performance of the microfacted epitaxial phosphors grown from melts in Tables IV and V are summarized in Table VI for both high and low power electron beam excitation. The performance data is given normalized to a reference specimen of known luminescent efficiency. This is done to demonstrate that the luminescence from the epitaxial film without microfacets ($\approx 0.7$) is as expected from other studies on $Tb^{3+}$ activated garnet phosphors with partial $Ga^{3+}$ substitution for $Al^{3+}$ (G. W. Berkstresser, J. Shmulovich, D. T. C. Huo, G. Matulis, C. D. Brandle and A. J. Valentino, Oct. 14–18, 1985, the Electrochemical Society meeting).

Given the expected performance of the luminescent phosphor composition without microfacets, the preparation of a tube with the microfacet epitaxial layer from the melt of composition given in Table IV yields an improvement of 330 percent at high power and 280 percent for low power density excitation.

TABLE VI

Faceted Faceplate Performance

| Structure | High Power | Low Power |
|---|---|---|
| facets | 2.09 | 2.12 |
| clear | 0.62 | 0.75 |
| reference | 1.0 | 1.0 |

The garnet material $Y_3ScAl_4O_{12}$ also serves as a single crystal substrate material with the substitution of Gd for Y or Ga for Al.

What is claimed is:

1. A device comprising a faceplate, said faceplate comprising a single crystal yttrium aluminum garnet substrate and a microfaceted epitaxial layer grown on at least part of the surface of said substrate, said microfaceted epitaxial layer including facets with surfaces along crystallographic planes other than that of the substrate, and said microfaceted epitaxial layer comprising a material which has a lattice constant 0.005 to 0.075 Angstroms larger than the lattice constant of said single crystal substrate.

2. The device of claim 1 in which the base dimensions of the microfacets are about 3–10 μm.

3. The device of claim 1 in which the lattice constant of the epitaxial layer is from 0.015 to 0.06 Angstroms larger than the lattice constant of the single crystal substrate.

4. The device of claim 3 in which the lattice constant of the epitaxial layer is 0.045±0.015 Angstroms larger than the lattice constant of the single crystal substrate.

5. The device of claim 1 in which the single crystal substrate is transparent.

6. The device of claim 1 in which the epitaxial layer comprises an activator ion.

7. The device of claim 1 in which the single crystal substrate comprises an activator ion.

8. The device of claim 1 in which the epitaxial layer is at least partially covered with a second epitaxial layer, said second epitaxial layer comprising an activator ion.

9. The device of claim 1 in which the faceplate is part of a cathode ray tube.

* * * * *